(12) United States Patent
Clevenger et al.

(10) Patent No.: US 8,614,115 B2
(45) Date of Patent: Dec. 24, 2013

(54) PHOTOVOLTAIC SOLAR CELL DEVICE MANUFACTURE

(75) Inventors: Lawrence A. Clevenger, Austin, TX (US); Harold J. Hovel, Austin, TX (US); Rainer Klaus Krause, Kostheim (DE); Kevin S. Petrarca, Austin, TX (US); Gerd Pfeiffer, Austin, TX (US); Kevin M. Prettyman, Austin, TX (US); Carl Radens, Austin, TX (US); Brian C. Sapp, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 440 days.

(21) Appl. No.: 12/916,236

(22) Filed: Oct. 29, 2010

(65) Prior Publication Data
US 2011/0100443 A1    May 5, 2011

(30) Foreign Application Priority Data
Oct. 30, 2009    (EP) ..................................... 09174561

(51) Int. Cl.
*H01L 21/00* (2006.01)
*H01L 31/18* (2006.01)

(52) U.S. Cl.
USPC ............................. 438/98; 438/537; 438/546

(58) Field of Classification Search
USPC ..................... 438/98, 546, 547, 548
See application file for complete search history.

(56) References Cited

U.S. PATENT DOCUMENTS

| 4,070,689 | A  | * | 1/1978  | Coleman et al. ............... 136/255 |
| 4,703,553 | A  | * | 11/1987 | Mardesich ........................ 438/89 |
| 5,510,271 | A  | * | 4/1996  | Rohatgi et al. .................. 438/57 |
| 5,641,362 | A  | * | 6/1997  | Meier ........................... 136/256 |
| 5,766,964 | A  | * | 6/1998  | Rohatgi et al. .................. 438/72 |
| 6,071,753 | A  | * | 6/2000  | Arimoto ......................... 438/57 |
| 6,524,880 | B2 | * | 2/2003  | Moon et al. ..................... 438/57 |
| 6,552,414 | B1 | * | 4/2003  | Horzel et al. .................. 257/655 |
| 6,696,739 | B2 |   | 2/2004  | Lee et al. |
| 7,335,555 | B2 |   | 2/2008  | Gee et al. |
| 7,833,808 | B2 | * | 11/2010 | Xu et al. ......................... 438/19 |
| 7,863,084 | B2 | * | 1/2011  | Hacke et al. .................... 438/98 |
| 7,884,375 | B2 | * | 2/2011  | Park et al. ...................... 257/80 |

(Continued)

FOREIGN PATENT DOCUMENTS

| JP | 2008153670 A | 7/2008 |
| JP | 2008243830 A | 10/2008 |

OTHER PUBLICATIONS

Phosphosilicate glass, PSG term definition, Semiconductor Glossary, http://www.semi1source.com/glossary/, accessed Apr. 20, 2013.*

(Continued)

*Primary Examiner* — David Vu
*Assistant Examiner* — Earl Taylor
(74) *Attorney, Agent, or Firm* — Steven L. Bennett

(57) ABSTRACT

A method for manufacturing a photovoltaic solar cell device includes the following. A p-n junction having a first doping density is formed. Formation of the p-n junction is enhanced by introducing a second doping density to form high doped areas for a dual emitter application. The high doped areas are defined by a masking process integrated with the formation of the p-n junction, resulting in a mask pattern of the high doped areas. A metallization of the high doped areas occurs in accordance with the mask pattern of the high doped areas.

3 Claims, 9 Drawing Sheets

(56) References Cited

U.S. PATENT DOCUMENTS

| | | | |
|---|---|---|---|
| 8,008,179 B2 * | 8/2011 | Yang et al. | 438/597 |
| 8,084,293 B2 * | 12/2011 | Riordon et al. | 438/98 |
| 8,110,431 B2 * | 2/2012 | Rohatgi et al. | 438/98 |
| 8,129,216 B2 * | 3/2012 | Eickelmann et al. | 438/98 |
| 8,163,638 B2 * | 4/2012 | De Ceuster et al. | 438/558 |
| 8,309,446 B2 * | 11/2012 | Weidman et al. | 438/558 |
| 2002/0153039 A1 * | 10/2002 | Moon et al. | 136/256 |
| 2004/0112426 A1 * | 6/2004 | Hagino | 136/261 |
| 2007/0107773 A1 | 5/2007 | Fork et al. | |
| 2007/0290283 A1 * | 12/2007 | Park et al. | 257/431 |
| 2008/0057220 A1 | 3/2008 | Bachrach et al. | |
| 2008/0092944 A1 * | 4/2008 | Rubin | 136/252 |
| 2008/0251117 A1 | 10/2008 | Schubert et al. | |
| 2008/0254203 A1 | 10/2008 | Zhou et al. | |
| 2008/0264477 A1 | 10/2008 | Moslehi | |
| 2008/0295887 A1 | 12/2008 | Moslehi | |
| 2009/0008787 A1 * | 1/2009 | Wenham et al. | 257/773 |
| 2009/0065047 A1 | 3/2009 | Fiorenza et al. | |
| 2009/0239331 A1 * | 9/2009 | Xu et al. | 438/98 |
| 2010/0279454 A1 * | 11/2010 | Eickelmann et al. | 438/72 |
| 2011/0100443 A1 * | 5/2011 | Clevenger et al. | 136/255 |
| 2012/0060908 A1 * | 3/2012 | Crafts | 136/255 |

OTHER PUBLICATIONS

Phospho-silicate glass, PSG term definition, Siliconfareast.com, http://www.siliconfareast.com/dielectric.htm, accessed Apr. 20, 2013.*

Wolf and Tauber, 16.2.8 Premetal Oxide Deposition and Contact Formation, Silicon Processing for the VLSI Era vol. 1: Process Technology $2^{nd}$ Edition, 2000.*

* cited by examiner

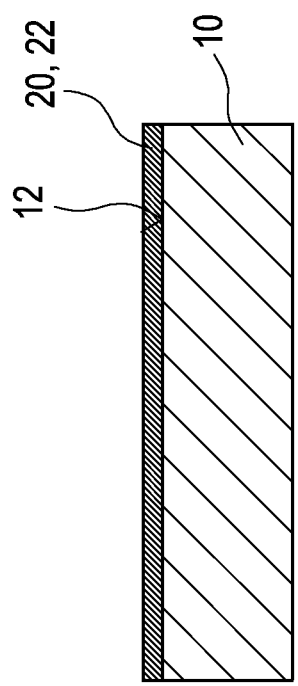
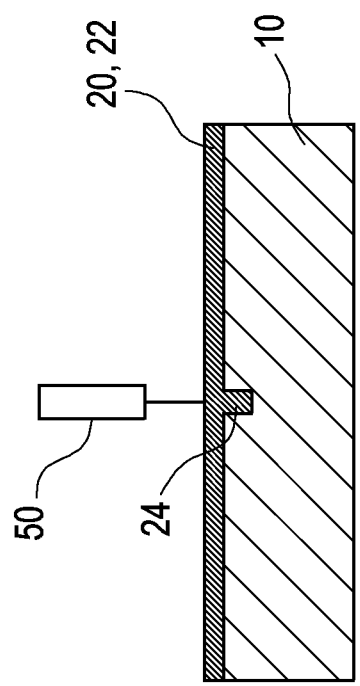
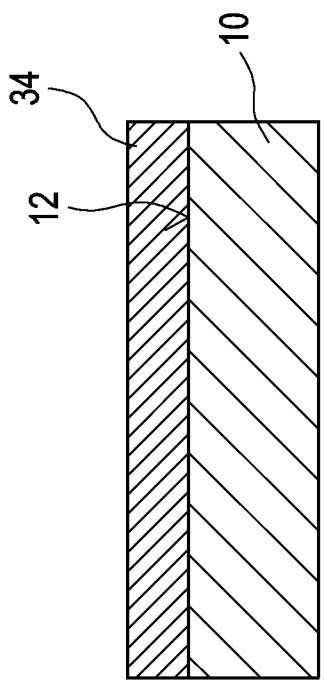
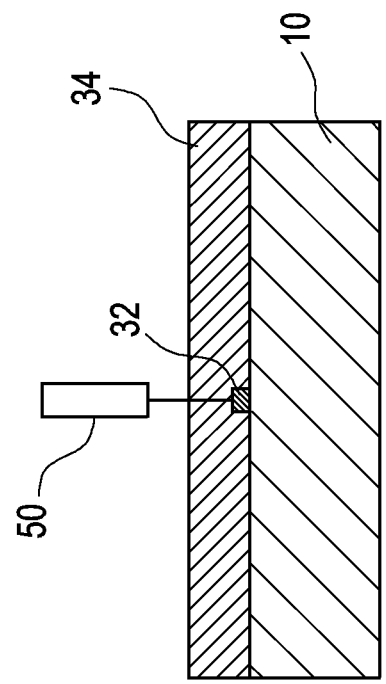

PHOTOVOLTAIC SOLAR CELL DEVICE MANUFACTURE

RELATED PATENT APPLICATIONS

The present patent application claims priority to the previously filed and presently pending European patent application entitled, "method for manufacturing a photovoltaic solar cell device," filed on Oct. 30, 2009, and assigned European Patent Office (EPO) patent application number 09174561.2.

FIELD OF THE INVENTION

The present invention relates generally to a method for manufacturing a photovoltaic solar cell device. More specifically, the present invention relates to a method for forming a dual emitter contact on a photovoltaic solar cell device.

BACKGROUND

Photovoltaic solar cells convert light energy, such as that from the sun, to electrical energy. One type of photovoltaic solar cell is known as dual emitter solar cell. In a dual emitter arrangement, high doped areas combined with low doped areas on a p-n junction reduce recombination processes of charge carriers at the p-n junction. As such, the efficiency of the solar cell is increased. However, forming a dual emitter is costly and requiring a dual emitter negatively affects manufacturing of the solar cell.

SUMMARY OF THE INVENTION

A method of an embodiment of the invention is for manufacturing a photovoltaic solar cell device. The method includes forming a p-n junction having a first doping density. The method includes enhancing formation of the p-n junction by introducing a second doping density to form high doped areas for a dual emitter application. The high doped areas are defined by a masking process integrated with the formation of the p-n junction, resulting in a mask pattern of the high doped areas. A metallization of the high doped areas occurs in accordance with the mask pattern of the high doped areas.

A method of another embodiment of the invention is for forming a p-n junction. A wafer with a wafer surface is provided, and the wafer is textured. A first cleaning is applied to the wafer surface, and a first doping is performed on the wafer surface to provide at least low doping areas of the p-n junction having a first doping density. A doped material is diffused into the wafer, and surface oxide is reduced. A second cleaning is applied to the wafer surface, and a passivation layer is applied on the wafer surface. Metallization of high doped areas of the p-n junction having a second doping density is provided through patterned deposition and/or aligned laser treatment, in accordance with a mask pattern.

A photovoltaic solar cell device of an embodiment of the invention includes a p-n junction. The device includes low doped areas within the p-n junction at a first doping density, and high doped areas within the p-n junction at a second doping density. The high doped areas are metalized.

BRIEF DESCRIPTION OF THE SEVERAL VIEWS OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

FIGS. 9a and 9b are diagrams depicting local doping starting from a cover layer and including irradiation by laser forming the local doped area, according to an embodiment of the invention.

FIGS. 10a and 10b are diagrams depicting formation of a metallization seed layer starting from a cover layer and including formation of the seed layer by laser irradiation, according to an embodiment of the invention.

DETAILED DESCRIPTION

Figure 1:
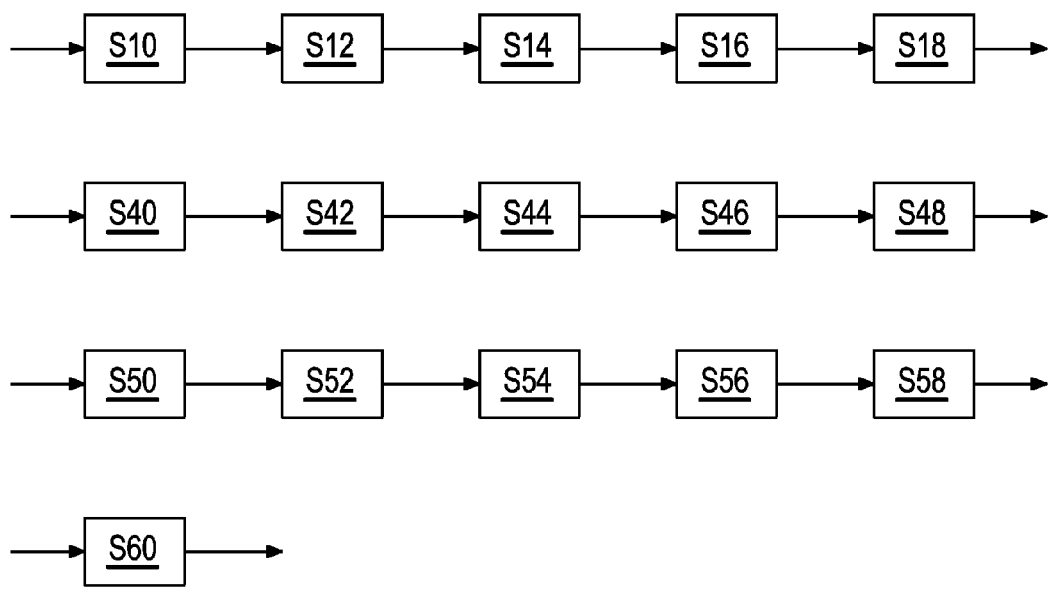
FIG. 1 is a flowchart of a manufacturing process for a solar cell device, according to the prior art.

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the embodiment of the invention is defined only by the appended claims.

Embodiments of the invention provide a cost efficient method for manufacturing a photovoltaic solar cell device with a dual emitter structure. In one embodiment, a method for manufacturing a photovoltaic solar cell device includes enhancing existing process steps for p-n junction formation by introducing a second doping density for making high doped areas for a dual emitter application. The high doped areas are defined by masking process steps that are integrated in process steps being part of the existing process steps for p-n junction formation, resulting in a mask pattern of the high doped areas. Metallization of the high doped areas is performed according to the mask pattern for formation of the high doped areas.

Advantageously, the general outline of the process steps is basically maintained. The high doped areas can be defined by a patterned doping and/or by a patterned etching. A cost effective process is provided for manufacturing solar cell devices. Additional costs for eventual additional doping, masking steps and removing the mask are overcompensated for by the gain in efficiency of the solar cell device by providing a dual emitter design with reduced recombination losses in the p-n junction. Favorably, additional process efforts can be managed by extending existing doping equipment within an existing process line setup. Stripping the mask layer can be included in an oxide etch and cleaning step performed on the wafer surface after diffusion.

In one embodiment, the manufacturing method may include providing wafer with a wafer surface; texturing the wafer and applying a first cleaning step to the wafer surface; and, performing a first doping step on the wafer surface. The method may further include diffusing doped material into the wafer; reducing surface oxide; applying a second cleaning step to the wafer surface; and, applying a passivation layer on the wafer surface. The method may also include providing metallization of the high doped areas through patterned deposition and/or aligned laser treatment. As such, and advantageously, a conventional process line setup can be maintained.

In one embodiment, enhancement of the existing process steps for p-n junction formation may include applying after the first doping step a second doping step with a high doping density which is patterned. The enhancement of the existing process steps for p-n junction formation may also include a first diffusion step at a lower temperature than a diffusion step following after the second diffusion step. The patterned second doping step secures that the high doped areas are formed on well defined locations only.

In another embodiment, existing process steps for p-n junction formation may be enhanced by, after the first doping and diffusion steps, performing a deposition step of a mask layer, and patterning the mask layer to forming the mask pattern for defining the high doped areas. Such enhancement may further include a high density doping step, a diffusion step, and a stripping step for stripping the mask layer. Expediently, at least some of the existing process steps can be performed basically unaltered. A mask stripping step can be performed safely during a following oxide etching step.

In one embodiment, existing process steps for p-n junction formation may be enhanced by, applying after the first cleaning step a single doping step with a high doping density through a transfer mask layer. The mask layer may particularly include silicon nitride and/or a silicon oxide. Particularly, the low doped areas and the high doped areas may result from the single doping step. More particularly, the enhancement of the existing process steps for p-n junction formation may include before the first doping step performing a deposition step a mask layer, and a patterning step the mask layer forming a mask pattern for defining the high doped areas. The enhancement may further include a high density doping as first doping step, a diffusion step in which high doped areas and low doped areas are formed simultaneously, and a stripping step for stripping the mask layer. Favorably, the single step doping process contains a single high density doping step. The areas for requiring a low density doping can be etched back using a reverse pattern technique.

In another embodiment, existing process steps for p-n junction formation may be enhanced by a forming step of a high doped p-n junction and an etch step for etching back a pattern after diffusion of the high doped material according to the pattern of an applied mask. Particularly, the enhancement of the existing process steps for p-n junction formation may include performing a high density doping as first doping step, and a masking step applying a polymer mask for defining the low and high doped areas. The enhancement may further include hardening the polymer mask, and an etch step to etch back the wafer surface and polymer mask forming high doped areas and low doping areas on the wafer surface simultaneously. Favorably, the single step doping process contains a single high density doping step. The areas in which a low density doping are required can be etched back using a reverse pattern technique. Expediently, the pattern for the high doped and low doped areas can be generated by polymer stamping of the high doped areas. All other areas can be etched back. This embodiment has a particular advantageous capability for high volume and high quality series production of solar cell devices. However, hard-mask techniques can be used as an alternative.

In one embodiment of the invention, enhancement of the existing process steps for p-n junction formation may include metallization of the high doped areas using the pattern of the mask for defining the low and high doped areas. Particularly, such metallization can be achieved by a screen printing technique. The screen printing technique may be that commonly used for manufacturing solar cell devices.

Enhancement of the existing process steps for p-n junction formation may include metallization of the high doped areas by a plating technique using a laser for preparing a seed layer. The laser can be used to enhance doping as well as plating. The laser supports the seed layer deposition at the spot where the laser beam irradiates the wafer surface due to known chemical and thermal effects. The doping as well as the plating positioning can be computer controlled. The doping locations can be recognized as the coordinates of the mask pattern. In case of metallization, the same coordinates can be used by computer controlled positioning to match contacts to high doped areas on the wafer.

Enhancement of the existing process steps for p-n junction formation may further include applying a laser supported pattern after the first doping process step. Movement of the laser is controlled to match the pattern of the mask to define the low and high doped areas. Furthermore, the high and/or low doping may be applied by wet doping, to achieve high volume capacity for a series production of solar cell devices.

A typical manufacturing process for a solar cell device for a high volume series production is illustrated in FIG. 1. In step S10 a wafer is loaded in a process line. The wafer may have a p-doped body. In step S12 the top surface of the wafer is textured, such as by a wet chemical KOH treatment of the surface. The surface is cleaned in a subsequent wet clean step S14. In doping step S16 a wet doping can be performed, such as an n-doping with phosphor at a low doping density for a p-n junction of the solar cell device. The wet doping may be performed by spraying phosphorous with a nozzle onto the wafer surface or by immersing the wafer into a wet chemical bath. In a diffusion step S18 the wafer is treated at elevated temperatures, such as at 807° C. for 30 minutes.

To remove surface oxide generated during the diffusion step S18, a subsequent oxide etch step S40 follows the diffusion, which is followed by a wet clean step S42. A passivation step S44 for passivation of the wafer surface is performed at medium temperatures, such as at 400° C. for 30 min, while the passivation layer, such as SiN, is deposited at a thickness of 50 nm to 100 nm. In step S46 the back side of the wafer is covered with backside bus bars, such as by screen printing, and a back mirror field is arranged on the wafer back side in step S48, also such as by screen printing.

In subsequent step S50 the screen print paste is dried at moderate temperatures, such as at 250° C. for 20 minutes. A front contact grid and bus bars are fabricated on the doped and passivated wafer surface in step S52, such as by screen printing. The screen print paste is dried at moderate temperatures, such as at 250° C. for 20 minutes in step D54. In firing step S56 the paste is fired at elevated temperatures, such as at 900° C. for 30 minutes. In an etch step S58 edges of the solar cell pattern are etched, particularly the entire device edge can be treated with etching to eliminate device shortages from previous process steps. The etch step S58 can be performed by wet etching or laser ablation, for instance. In step 60 the wafer is tested and classified.

Figure 2:
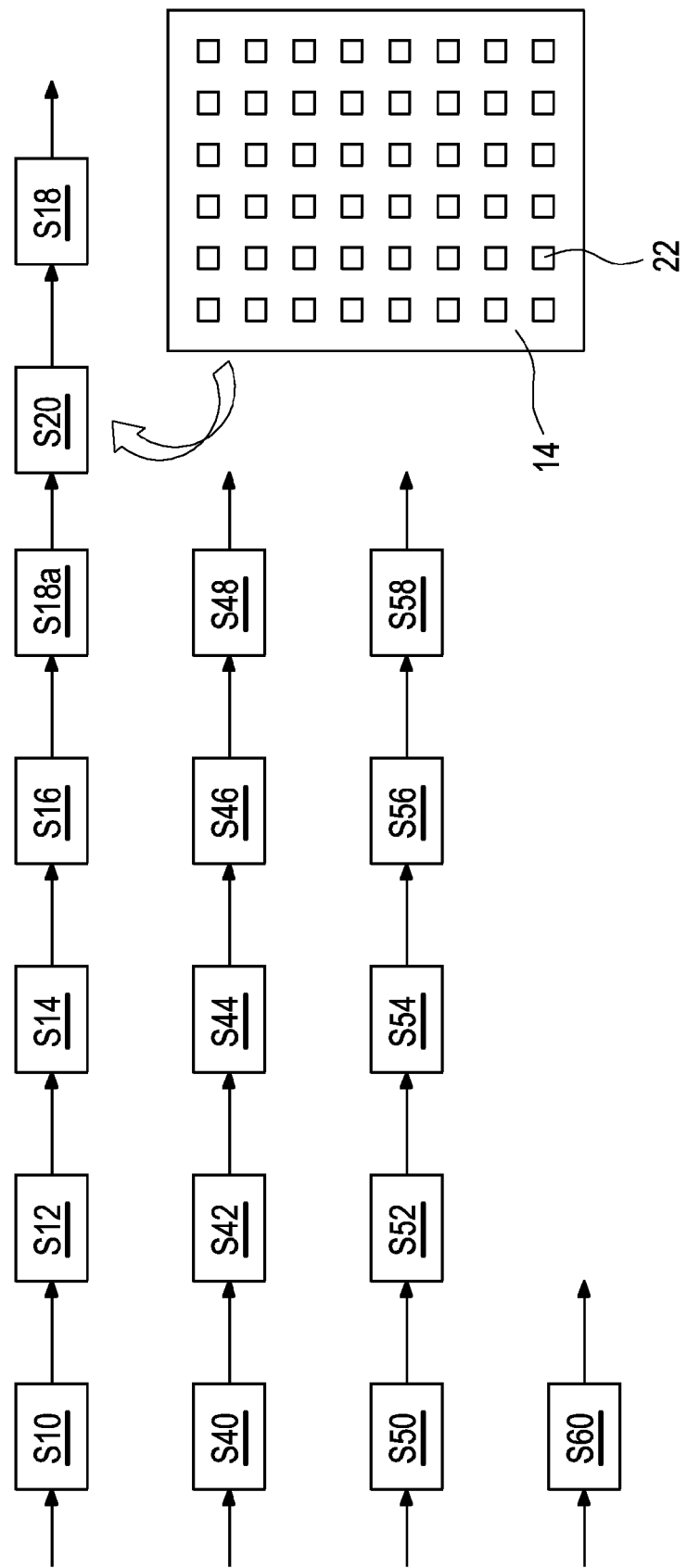
FIG. 2 is a flowchart of a first manufacturing process for a solar cell device, according to an embodiment of the invention.
Figure 3:
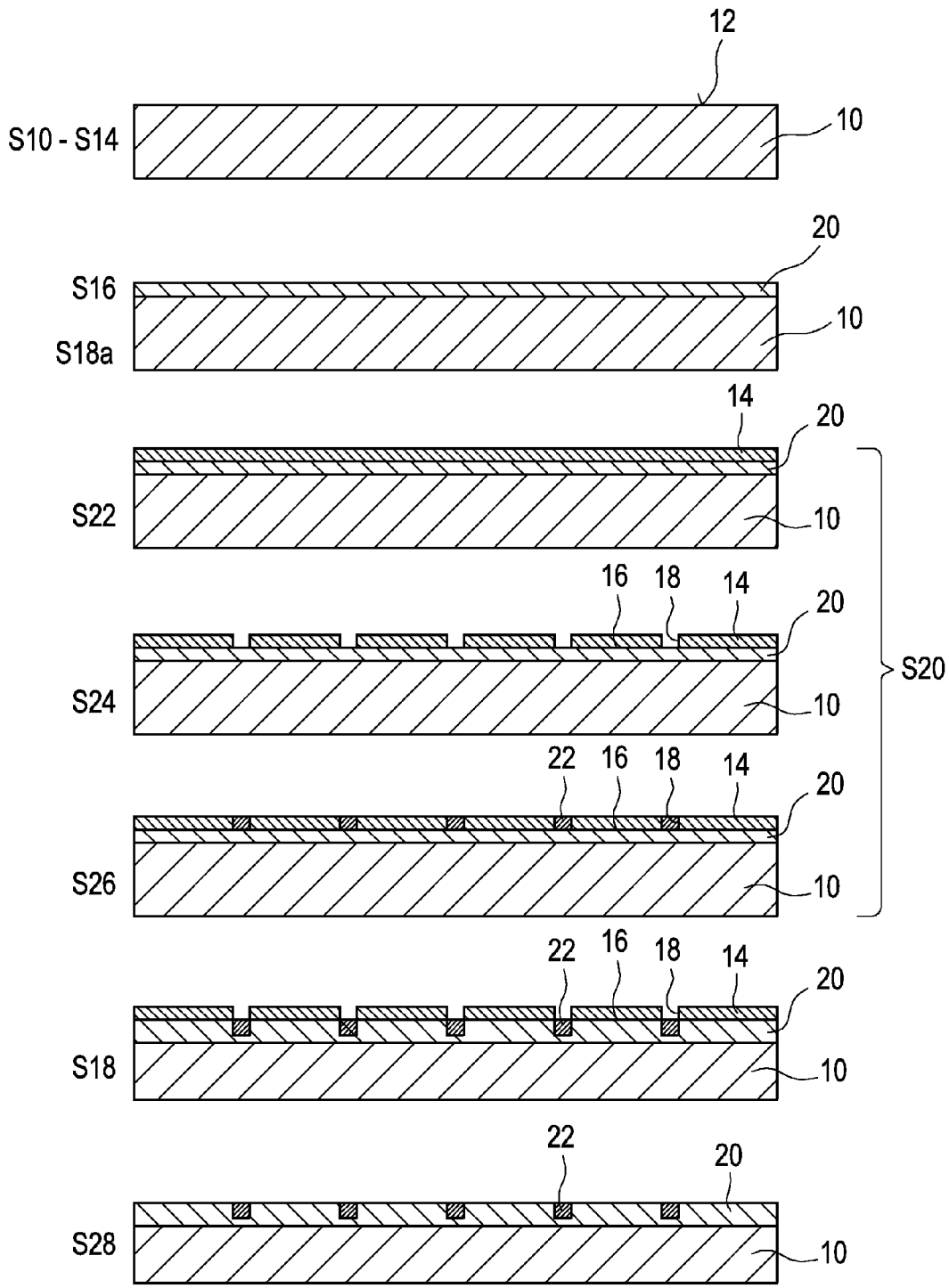
FIG. 3 is a diagram of a side view a cut through a wafer illustrating a process of an example embodiment of the invention including forming a mask pattern after a first doping step and including a second doping step.

FIG. 2 in combination with FIG. 3 shows a first embodiment of an enhancement of the existing process steps S10-S60 for p-n junction formation shown in FIG. 1 by introducing a second doping density for making high doped areas 22 for a dual emitter application. The high doped areas 22 are defined by masking process steps S22-S28 that are integrated in process steps S16-S18 being part of the existing process steps S10-S60 for p-n junction formation, resulting in a mask pattern 16, 18 of the high doped areas 22. Metallization of the high doped areas 22 is achieved according to the mask pattern 16, 18 for formation of the high doped areas 22. The shape of the high doped areas 22 may be chosen arbitrarily. The size as well as the spacing of the high doped areas 22 can be optimized expediently depending on a desired device performance. A typical spot size of an individual high doped area 22 can be between 25 µm to 75 µm, such as around about 50 µm, while the pitch between high doped areas 22 can be between 0.25 mm to 1.75 mm, such as between 0.5 mm to 1.5 mm.

FIG. 3 illustrates the process-steps enhancement in a side view cut through a wafer 10 illustrating in detail process steps including forming a mask pattern after a first doping step and including the second doping step. In particular, the wafer 10 with a wafer surface 12 is provided and treated with steps S10-S14 as described above. The enhancement of the existing process steps S10-S60 for p-n junction formation includes, after the first doping step S16 with a low density doping 20, covering virtually the complete wafer surface 12, and a pre-diffusion step S18a at a medium temperature, such as at 400° C. for 15 minutes, where such temperature and time are below the parameters of conventional diffusion step S18.

The enhancement further includes a deposition step S22 of a mask layer 14 followed by a patterning step S24 of the mask layer 14 forming the mask pattern 16, 18 with openings 18 and covered areas 16 for defining the high doped areas 22, a high density doping step S26 which may be a wet doping step, and a diffusion step S18. The diffusion step S18 may occur at elevated temperatures, such as 870° C. for 30 minutes. A stripping step S28 is performed for stripping the mask layer 14. The manufacturing process may continue with step 40 (FIG. 1). The patterning step S24 of the mask layer 14 may be performed with laser ablation.

Step 28 may be included in wet etch step S40. Steps S22, S24, S26 (and consequently S28) may be replaced by a hardmask step S20 where a separate patterned sheet-like hard mask is arranged on the wafer surface 12 instead of deposition of a mask layer 14 on the wafer surface 12. When the mask layer is stripped (or the hard mask removed), the high doped areas 22 are flush with and embedded in the low doped areas 20. The high doped areas 22 are formed in the openings 18 of the mask layers whereas the low doped areas 20 are formed below the tight portions 16 of the mask layer 14.

Figure 4:
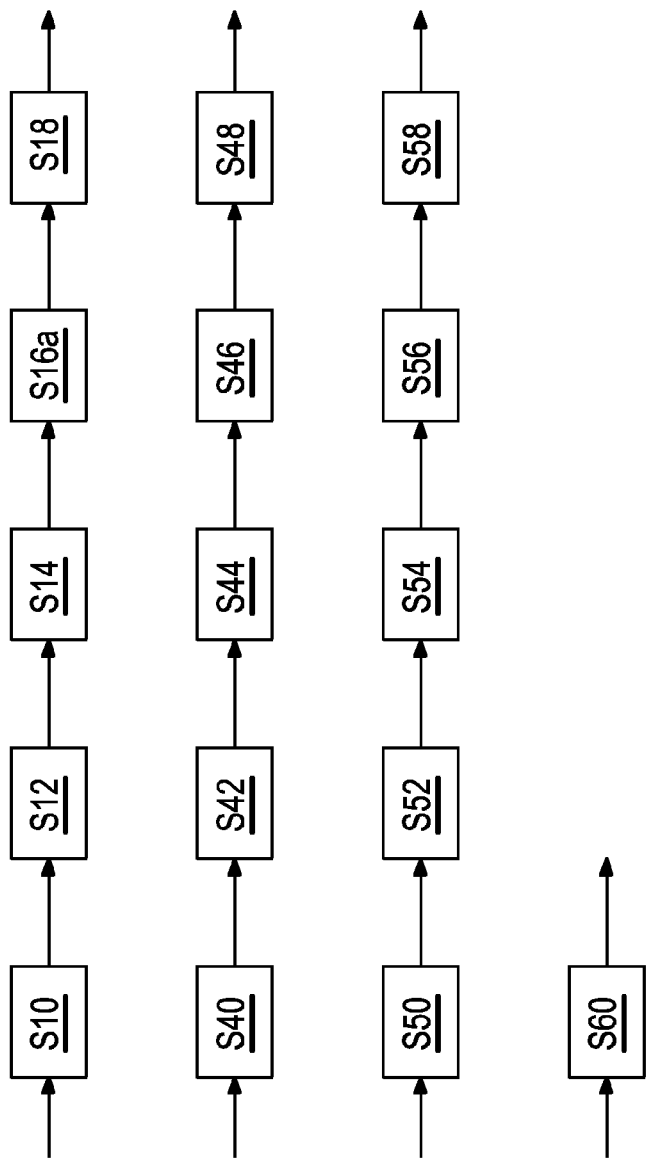
FIG. 4 is a flowchart of a second manufacturing process for a solar cell device, according to an embodiment of the invention.
Figure 5:
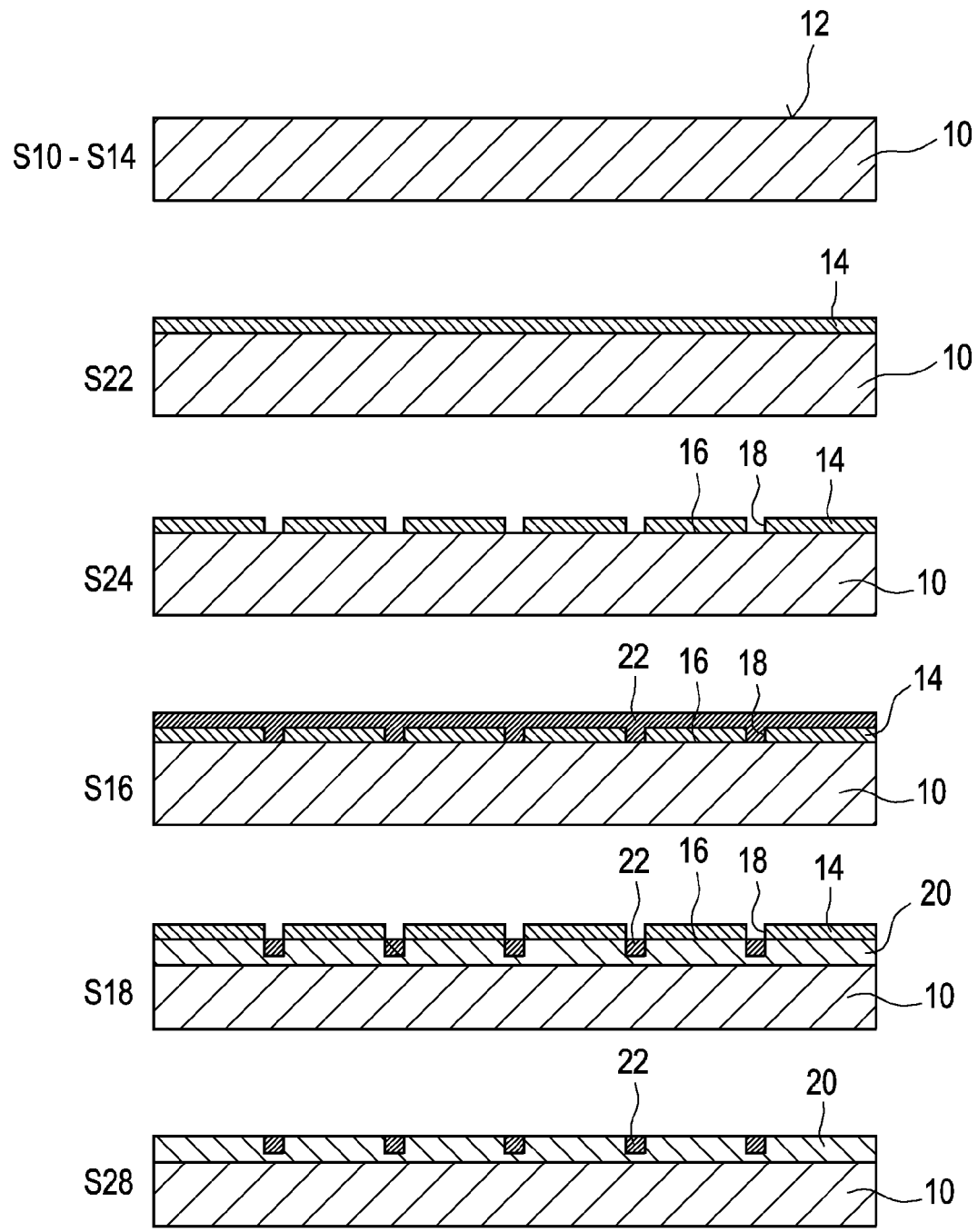
FIG. 5 is a diagram of a side view a cut through a wafer illustrating a process of a further example embodiment according to the invention including forming a mask pattern prior to a first doping step, in which low and high doped areas are formed simultaneously by diffusion.

FIGS. 4 and 5 illustrate a second embodiment of enhancement of the existing process steps S10-S60 for p-n junction formation shown in FIG. 1, by introducing a second doping density for making high doped areas 22 for a dual emitter application. The high doped areas 22 are defined by masking process steps S22-S28 which are integrated in process steps S16-S18 being part of the existing process steps S10-S60 for p-n junction formation, resulting in a mask pattern 16, 18 of the high doped areas 22. A metallization of the high doped areas 22 is performed according to the mask pattern 16, 18 for formation of the high doped areas 22.

The enhancement of the existing process steps S10-S60 for p-n junction formation includes applying after the first cleaning step S14 a single doping step S16a with a high doping density through a transfer mask layer 14. The mask layer 14 particularly includes silicon nitride and/or a silicon oxide. The low doped areas 20 and the high doped areas 22 result from the single doping step S16a. The enhancement includes, before the first doping step S16a, depositing a mask layer 14 in a deposition step S22, and a patterning step S24 for the mask layer 14 forming a mask pattern 16, 18 for defining the high doped areas 22. The enhancement further includes a high density doping as the first doping step S16a, a diffusion step S18 in which high doped areas 22 and low doped areas 20 are formed simultaneously, and a stripping step S28 for stripping the mask layer 14. The process may continue with step S40 as described in FIG. 1. Expediently, the stripping step 28 can be integrated in step 40.

Figure 6:
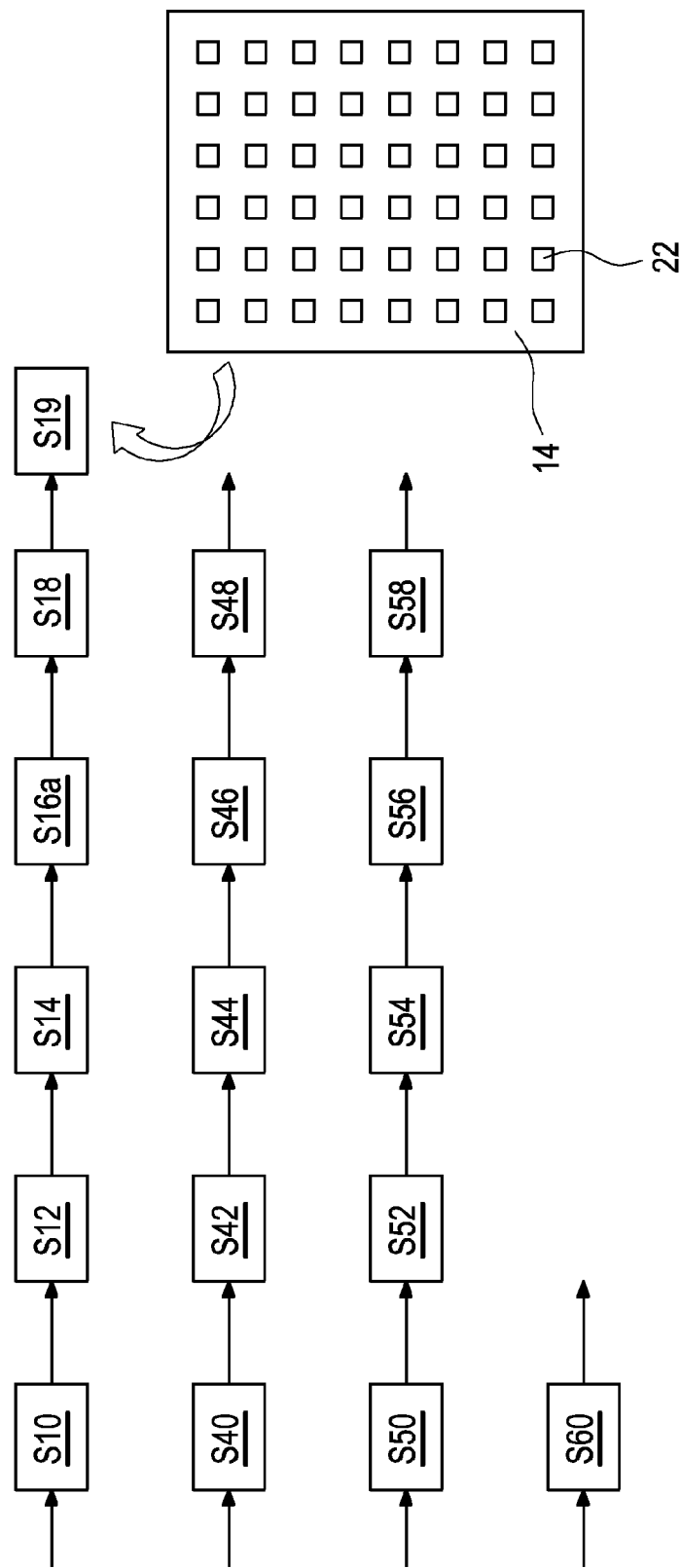
FIG. 6 is a flowchart of a third manufacturing process for a solar cell device, according to an embodiment of the invention.
Figure 7:
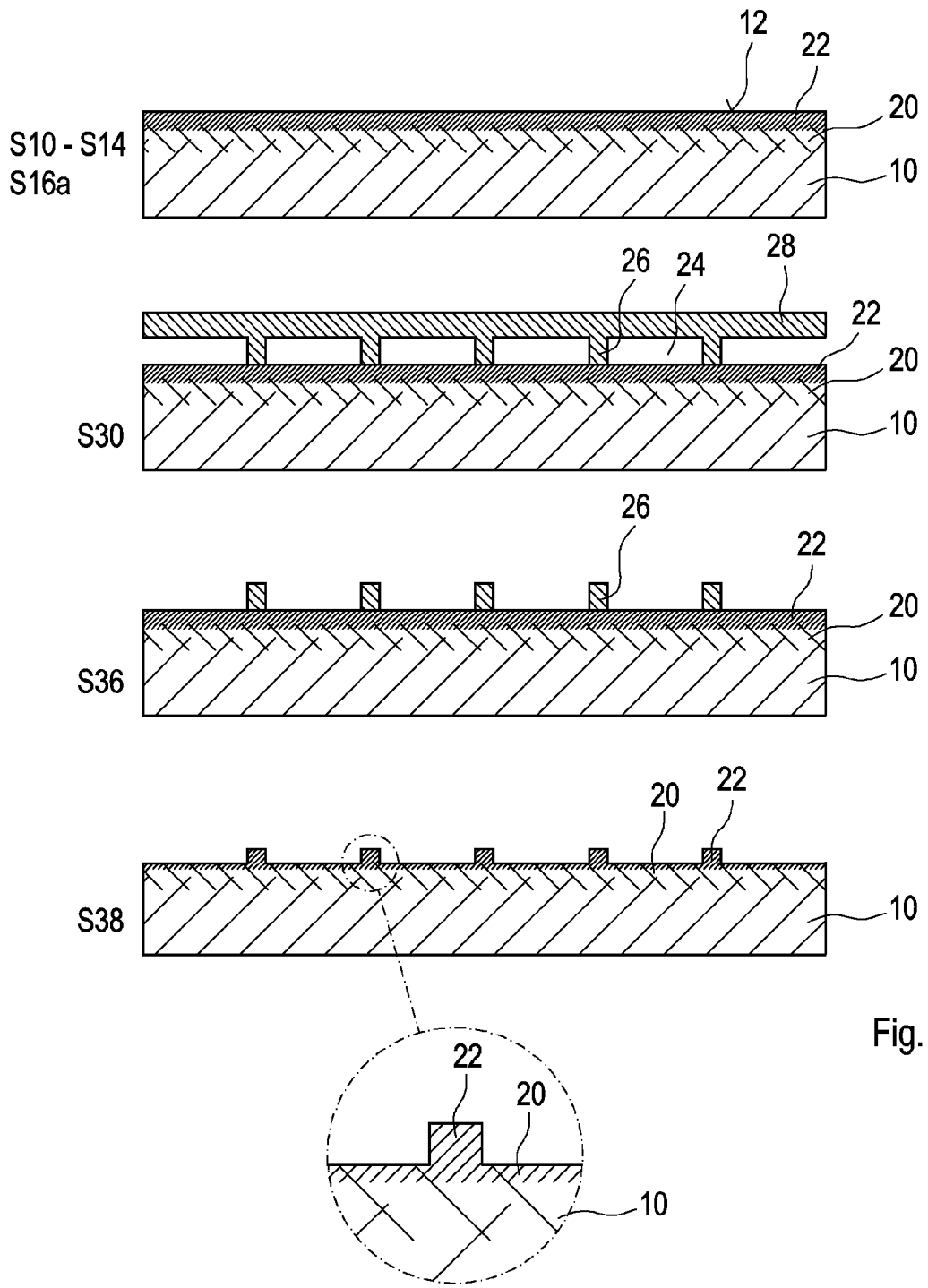
FIGS. 7a and 7b are diagrams of a side view a cut through a wafer illustrating a process of a further example embodiment according to the invention including forming a mask pattern after to a first doping step where low and high doped areas are formed simultaneously as a dopant gradient at the wafer surface.

FIGS. 6, 7a, and 7b illustrate a third embodiment of an enhancement of the existing process steps S10-S60 for p-n junction formation shown in FIG. 1 by introducing a second doping density for making high doped areas 22 for a dual emitter application. The high doped areas 22 are defined by masking process steps S22-S28 that are integrated in process steps S16-S18 being part of the existing process steps S10-S60 for p-n junction formation, resulting in a mask pattern 16, 18 of the high doped areas 22. A metallization of the high doped areas 22 is performed according to the mask pattern 16, 18 for formation of the high doped areas 22.

The enhancement of the existing process steps S10-S60 for p-n junction formation includes a forming step S16a of a high doped p-n junction and an etch step S38 for etching back a pattern 24, 26 after diffusion of the high doped material (step S18) according to the pattern 24, 26 of an applied mask 28. The enhancement further includes performing a high density doping as first doping step S16a, a masking step S30 applying a polymer mask 28 for defining the low and high doped areas 20, 22, and hardening the polymer mask 28. The enhancement also includes an etch step S38 etching back the wafer surface 12 and polymer mask 28, forming high doped areas 22 and low doped areas 20 on the wafer surface 12 simultaneously.

Particularly, the masking step S30 may include depositing the wafer 10 with the polymer, applying a stamp for generating the mask pattern 26, 28 in the polymer. The stamp may apply heat or light irradiation to the polymer. The heated or irradiated areas 26 are cured so that the non-heated or non-irradiated areas 24 can be easily removed. The polymer is developed and is hardened, such as by ultraviolet irradiation. Then, in step S38 the surface 12 of the wafer 10 is etched back, where the areas 26 protect the underlying areas of the wafer 10. Accordingly, the high doped areas 22 are protruding from the surface 12 of the wafer 10, whereas the low doped areas 20 are in recesses formed during the etch step S38 arranged between the high doped areas 22. This is depicted in FIG. 7b in an enlarged view of a high doped area 22.

Figure 8:
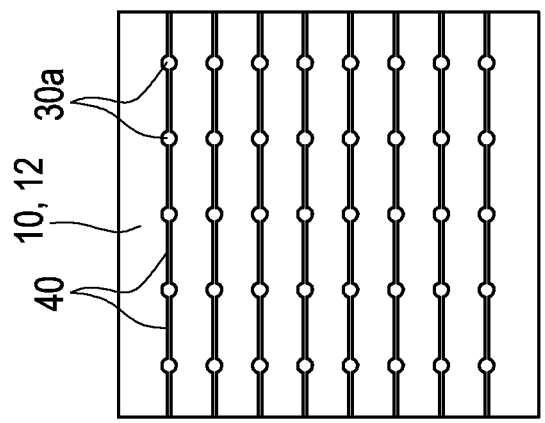
FIGS. 8a, 8b, and 8c are diagrams of a top view of a mask pattern for high doping areas and metallization, according to varying embodiments of the invention.
Figure 8:
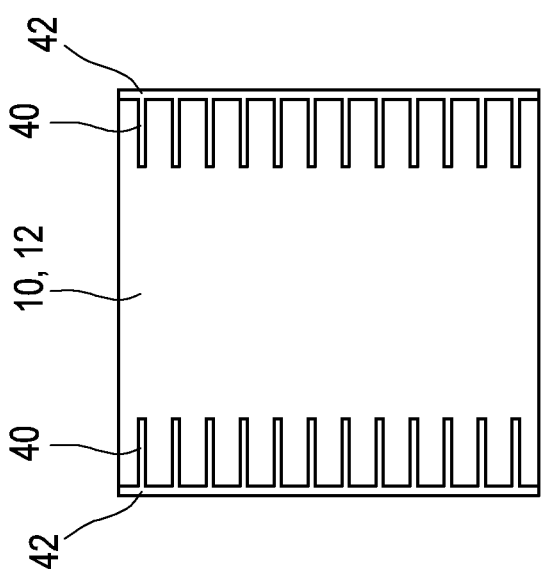
Figure 8:
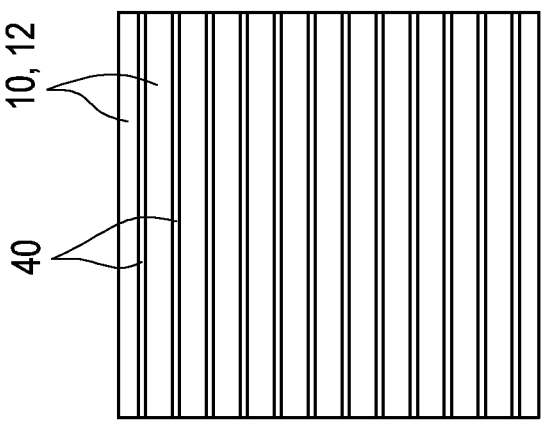

The enhancement of the existing process steps S10-S60 for p-n junction formation can include metalizing the high doped areas 22 using the pattern 16, 18; 24, 26 of the mask 14, 28 for defining the low doped areas 20 and high doped areas 22, as shown in FIGS. 8a, 8b and 8c. FIG. 8a shows lines as contacts 40 as the metallization of the wafer surface 12. FIG. 8b shows two complementary fingerlike sets of lines 40 at each side of the wafer surface 12, where each set of fingerlike lines 40 is connected with a bar 42. FIG. 8c shows lines 40 with dots 30a as metallization. The various patterns can be generated with the same mask pattern that is used for defining the high doped areas 22 on the wafer 10. The metallization can be made with a screen printing technique, by a plating technique and/or with a laser supported technique.

FIGS. 9a, 9b, 10a, and 10b illustrate examples of laser supported techniques. FIGS. 9a and 9b illustrate a doping technique in which a doped coating is applied, such as by wet doping of the wafer 10. When the coated wafer surface 12 is irradiated by a laser 50, the doping can be driven into the wafer 10 by local heating of the laser surface 12 with the laser 50.

FIGS. 10a and 10b illustrate a laser technique where a seed layer 32 for metallization is generated on the wafer surface 12. A seed layer 32, such as nickel, is expedient on a wafer surface 10 for improving the contact force between the metallization, such as copper, tantalum or the like, and the wafer surface 12. The seed layer 32 can also prevent copper from migrating into the silicon body of the wafer 10. The wafer 10 is coated with a metallization layer 34 in a plating bath. When the coated wafer surface 12 is irradiated by a laser 50, the layer 34 can be cured and localized as seed layer 32 on defined locations on the wafer surface 12 with a good adhesion. On top of the seed layer 32, which is comparably thin, a thick metal layer can be deposited with good adhesion and low contact resistance to the wafer 10.

The movement of the laser 50 for either laser supported doping or laser supported formation of the seed layer 32 can be controlled in a way to match the pattern of the mask 14, 28 for defining the low and high doped areas 20, 22 as described in the embodiments above.

It is noted that, although specific embodiments have been illustrated and described herein, it will be appreciated by those of ordinary skill in the art that any arrangement calculated to achieve the same purpose may be substituted for the specific embodiments shown. This application is thus intended to cover any adaptations or variations of embodiments of the present invention. As such and therefore, it is manifestly intended that this invention be limited only by the claims and equivalents thereof.

What is claimed is:

1. A method for manufacturing a photovoltaic solar cell device, comprising:
   forming a p-n junction having a first doping density, comprising:
      providing a wafer with a wafer surface, texturing the wafer, and applying a first cleaning to the wafer surface;
      performing a first doping on the wafer surface to provide a doped material on the wafer surface;
      diffusing the doped material into the wafer from the wafer surface, to realize the first doping density;
      reducing surface oxide, applying a second cleaning to the wafer surface, and applying a passivation on the wafer surface;
      providing metallization of the high doped areas through patterned deposition and/or aligned laser treatment;
   enhancing formation of the p-n junction by introducing a second doping density to form high doped areas for a dual emitter application, comprising:
      performing a second doping with a high doping density that is patterned using a mask pattern, to provide a second doped material on the wafer surface; and
      performing a first diffusion and a second diffusion of the second doped material into the wafer from the wafer surface, to realize the second doping density,
   wherein the high doped areas are defined by a masking process integrated with the formation of the p-n junction, resulting in the mask pattern of the high doped areas,
   wherein the metallization of the high doped areas occurs in accordance with the mask pattern of the high doped appears,
   and wherein the first diffusion is performed at a lower temperature than the second diffusion.

2. The method according to claim 1, wherein enhancing the formation of the p-n junction formation further comprises, after performing the first doping on the wafer surface and after performing the first diffusion and the second diffusion:
   depositing a mask layer;
   patterning the mask layer to form the mask pattern defining the high doped areas;
   performing a third doping with another high density doping, to provide a third doped material on the wafer surface;
   performing a third diffusion of the third doped material into the wafer from the wafer surface, to further realize the second doping density; and
   stripping the mask layer.

3. A method for manufacturing a photovoltaic solar cell device, comprising:
   forming a p-n junction having a first doping density, comprising:
      providing a wafer with a wafer surface, texturing the wafer, and applying a first cleaning to the wafer surface;
      performing a first doping on the wafer surface to provide a doped material on the wafer surface;
      diffusing the doped material into the wafer from the wafer surface, to realize the first doping density;
      reducing surface oxide, applying a second cleaning to the wafer surface, and applying a passivation layer on the wafer surface;
      providing metallization of the high doped areas through patterned deposition and/or aligned laser treatment;
   enhancing formation of the p-n junction by introducing a second doping density to form high doped areas for a dual emitter application, comprising:
      applying a mask;
      diffusing a high doped material according to a pattern of the mask, using a masking process, to realize the second doping density, the high doped material having a greater doping than the doped material;
      first etching back the pattern of the mask;
      performing a high density doping as the second doping on the wafer surface, to further realize the second doping density;
      applying a polymer mask to define low doped areas and the high doped areas from the high doped material that has been diffused, the polymer mask being different than the mask;
      hardening the polymer mask; and second etching back the wafer surface and the polymer mask to simultaneously form the high doped areas and the low doped areas on the wafer surface,
wherein the high doped areas are defined by the masking process integrated with the formation of the p-n junction, resulting in the pattern of the mask for the high doped areas,
and wherein the metallization of the high doped areas occurs in accordance with the pattern of the mask of the high doped areas.

* * * * *